United States Patent
Kern et al.

(10) Patent No.: US 10,302,502 B2
(45) Date of Patent: May 28, 2019

(54) DETERMINING RATE OF CHANGE IN TEMPERATURE MEASUREMENTS

(71) Applicant: Microchip Technology Incorporated, Chandler, AZ (US)

(72) Inventors: Lynn R. Kern, Tucson, AZ (US); Mitchell E. Polonsky, Chandler, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 710 days.

(21) Appl. No.: 14/592,379

(22) Filed: Jan. 8, 2015

(65) Prior Publication Data

US 2015/0330841 A1 Nov. 19, 2015

Related U.S. Application Data

(60) Provisional application No. 61/993,481, filed on May 15, 2014.

(51) Int. Cl.
*G01K 3/10* (2006.01)
*G06F 1/20* (2006.01)
(Continued)

(52) U.S. Cl.
CPC .............. *G01K 3/10* (2013.01); *G01K 7/425* (2013.01); *G05B 15/02* (2013.01); *G05B 23/0235* (2013.01); *G06F 1/206* (2013.01); *G06F 17/10* (2013.01); *H05K 7/20136* (2013.01); *H05K 7/20209* (2013.01); *G01K 2219/00* (2013.01)

(58) Field of Classification Search
None
See application file for complete search history.

(56) References Cited

U.S. PATENT DOCUMENTS

| | | | |
|---|---|---|---|
| 4,228,511 A | 10/1980 | Simcoe et al. | 700/278 |
| 7,177,218 B2 | 2/2007 | Choi et al. | 365/211 |

(Continued)

FOREIGN PATENT DOCUMENTS

| | | | |
|---|---|---|---|
| CN | 101865151 A | 10/2010 | F04D 27/00 |
| CN | 102722193 A | 10/2012 | G05D 23/20 |

(Continued)

OTHER PUBLICATIONS

International Search Report and Written Opinion, Application No. PCT/US2015/031030, 12 pages, dated Aug. 13, 2015.

(Continued)

*Primary Examiner* — Eric C Wai
(74) *Attorney, Agent, or Firm* — Slayden Grubert Beard PLLC

(57) ABSTRACT

A temperature sensor device has a digital interface with a first memory storing a current temperature value which can be read through the digital interface and a second memory storing a rate of temperature change value which can be read through the digital interface. Such a temperature sensor can be preferably used in a system with a cooling fan and a processor coupled with the digital interface of the temperature sensor. The processor is operable to control the cooling fan based on temperature measurement values and the rate of change in temperature retrieved from the temperature sensor through the digital interface.

24 Claims, 9 Drawing Sheets

(51) Int. Cl.
*G05B 23/02* (2006.01)
*G01K 7/42* (2006.01)
*H05K 7/20* (2006.01)
*G06F 17/10* (2006.01)
*G05B 15/02* (2006.01)
*G05D 23/00* (2006.01)

(56) References Cited

U.S. PATENT DOCUMENTS

| | | | | |
|---|---|---|---|---|
| 2007/0140315 | A1 | 6/2007 | Janzen et al. | 374/170 |
| 2007/0297893 | A1* | 12/2007 | Alon | F04D 25/166 |
| | | | | 415/47 |
| 2012/0126771 | A1* | 5/2012 | Tuten | G01R 19/0053 |
| | | | | 323/284 |
| 2013/0090881 | A1 | 4/2013 | Janardhanan et al. | 702/104 |
| 2013/0090889 | A1 | 4/2013 | Vaidyanathan et al. | 702/136 |

FOREIGN PATENT DOCUMENTS

| | | | | |
|---|---|---|---|---|
| DE | 102008053064 B3 | 4/2010 | | G01K 3/10 |
| GB | 1507268 A | 4/1978 | | G01D 1/18 |

OTHER PUBLICATIONS

Taiwan Office Action, Application No. 104115655, 16 pages, dated Nov. 9, 2018.
Chinese Office Action, Application No. 201580027019.8, 10 pages, dated Sep. 25, 2018.
European Office Action, Application No. 15726817.8, 3 pages, dated Oct. 11, 2018.

* cited by examiner

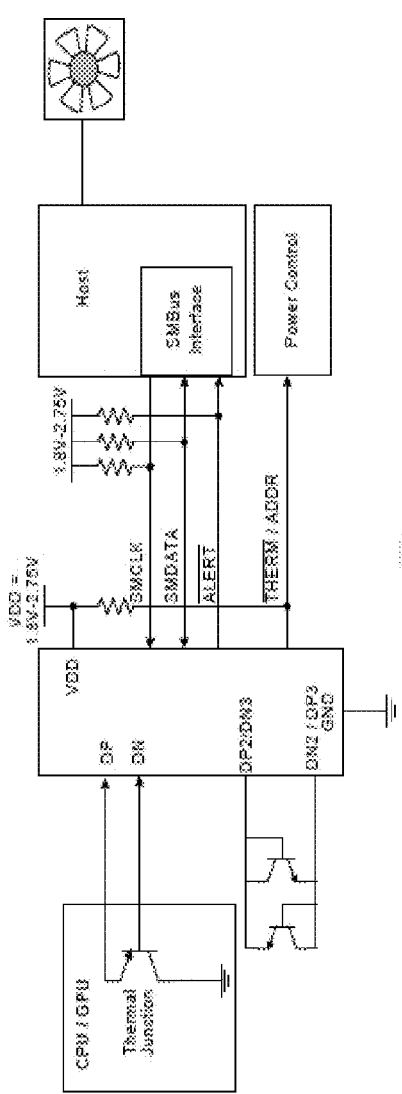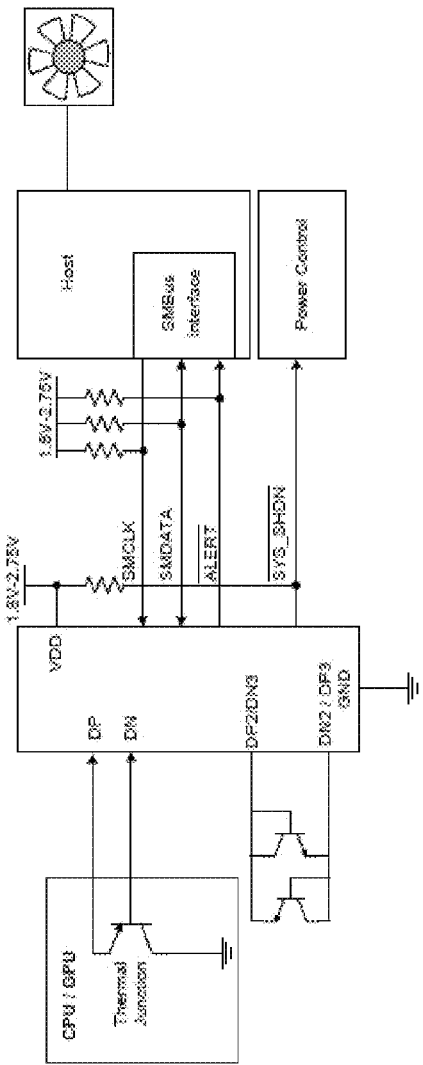

DETERMINING RATE OF CHANGE IN TEMPERATURE MEASUREMENTS

CROSS-REFERENCE TO RELATED APPLICATIONS

This application claims the benefit of U.S. Provisional Application No. 61/993,481 filed on May 15, 2014, which is incorporated herein in its entirety.

TECHNICAL FIELD

The present disclosure relates to temperature monitoring, in particular to integrated temperature sensors.

A wide variety of different integrated temperature sensors is available. For example, analog sensors exist that operate with a supply voltage and generate an output signal having a voltage level that corresponds to a temperature according to a given relationship. A user merely needs to convert the analog signal to a digital signal and process the converted value according to the given relationship.

Digital temperature sensors are also available to already include the respective conversion algorithm and make the actual temperature value available through a serial communication interface, for example, an I²C interface, SMBus interface, or an SPI interface.

Many applications require such sensors to control a system into which such sensors are integrated. For example, computer systems often include a plurality of such sensors placed at sensitive locations and a variety of temperature control means such as fans or system control means that regulate power consumption, clock speed, etc. to actively regulate the temperature within the system. In particular, mobile computers, such as laptop computers often require the regulation and control of the temperature of various components.

The temperature within such systems often changes dynamically and requires a quick system response to avoid system failure due to overheating. However, none of the conventional temperature sensors is capable to provide any type of dynamic parameter with respect to the temperature

SUMMARY

Hence, there exists a need for an improved temperature sensor. According to an embodiment, a temperature sensor device comprises a digital interface with a first memory storing a current temperature value which can be read through the digital interface; and a second memory storing a rate of temperature change value which can be read through the digital interface.

According to a further embodiment, the second memory may store the result of a calculation performed within the temperature sensor using a plurality of sequential temperature measurement samples defining a measurement interval. According to a further embodiment, the number of samples can be programmable. According to a further embodiment, the second memory may further store whether a slope direction changes. According to a further embodiment, the second memory may store the number of times a slope direction changes within the measurement interval. According to a further embodiment, the temperature sensor may further comprise an external alert output connection controlled by the rate of temperature change value. According to a further embodiment, the first memory may store an average temperature value. According to a further embodiment, a number of temperature values used to calculate the average temperature value may be programmable. According to a further embodiment, the rate of temperature change value can be calculated by:

$$\frac{\Delta T}{\Delta t} = \frac{[T(t_{max}) - T(t_0)] \cdot \text{gain}}{\text{samples}}$$

where:
$T(t_{max})$=temperature at the end the interval
$t(t_0)$=temperature at the beginning of the interval According to a further embodiment, the second memory can be a register accessible by the digital interface. According to a further embodiment, the second memory can be provided by a plurality of registers.

According to another embodiment, an electronic device may comprise a temperature sensor configured to determine a rate of change in a measured temperature which can be accessed through a digital interface, a cooling fan, and a processor coupled with the digital interface of the temperature sensor and being operable to control the cooling fan based on temperature measurement values and the rate of change in temperature retrieved from the temperature sensor through the digital interface.

According to yet another embodiment, a method for providing temperature data by a temperature sensor device comprising a digital interface may comprise the steps: storing a current temperature value in a first memory which can be read through the digital interface; and storing a rate of temperature change value in a second memory which can be read through the digital interface.

According to a further embodiment of the method, the second memory may store a calculation performed within the temperature sensor using a plurality of sequential temperature measurement samples defining a measurement interval. According to a further embodiment of the method, the number of samples can be programmable. According to a further embodiment of the method, the second memory may further store whether a slope direction changes. According to a further embodiment of the method, the second memory may store the number of times a slope direction changes within the measurement interval. According to a further embodiment of the method, the method may further comprise the step of outputting a signal through an external alert output connection depending on the rate of temperature change value. According to a further embodiment of the method, the first memory can be a memory block and also may store an average temperature value. According to a further embodiment of the method, a number of temperature values used to calculate the average temperature value can be programmable. According to a further embodiment of the method, the rate of temperature change value can be calculated by:

$$\frac{\Delta T}{\Delta t} = \frac{[T(t_{max}) - T(t_0)] \cdot \text{gain}}{\text{samples}}$$

where:
$T(t_{max})$=temperature at the end of the interval
$T(t_0)$=temperature at the beginning of the interval According to a further embodiment of the method, the second memory can be a register accessible by the digital interface. According to a further embodiment of the method, the second memory can be provided by a plurality of registers forming a register block.

According to yet another embodiment, a method for controlling a temperature in a system comprising a temperature sensor configured to determine a rate of change in a measured temperature which can be accessed through a digital interface, a cooling fan, and a processor coupled with the digital interface of the temperature sensor, may comprise the steps of: determining a rate of change of a measured temperature; controlling the cooling fan based on temperature measurement values and the rate of change in the temperature.

BRIEF DESCRIPTION OF THE DRAWINGS

FIGS. 5A and 5B show a table of special function registers that can be implemented in various embodiments;

FIGS. 6A and 6B shows block diagrams of systems implementing a temperature sensor according to various embodiments;

DETAILED DESCRIPTION

In electronic devices, rapid changes in temperature can be very detrimental to the proper functioning and therefore to the reliability of the electronic device. For example, in the laptop and desktop environments, rapid changes in CPU core temperature can be very detrimental to the long term reliability of the processor. To minimize the thermal damage effects, an entire industry has been built around pulling heat from the processor while allowing that processor clocks to run as fast as possible. When attempting to cool the processor, or anything else that can exhibit one to many degrees per second of temperature shift, knowing the rate at which it is heating/cooling in terms of degrees per second is a valuable piece of information to know. It will help determine whether the fan runs at 60% or 100%, a noticeable difference to the end user. As we move away from devices with cooling fans, the ability to determine how fast the temperature is changing is just as important as the current temperature of the device. With no active cooling, the system must rely on power and clock management to control the temperature. Knowing this rate without having to use system resources becomes very valuable, as calculations equate to heat, the very thing being controlled.

According to various embodiments, a method can be provided to determine the slope of a temperature profile in real time.

According to various embodiments, the temperature data being collected already can be used to determine the magnitude of the slope of a temperature profile. It can be implemented as a purely digital process, as it relies on devices with various possible embodiments for the analog sections being used that perform the actual temperature measurement. Multiple temperature sensors may be provided and their data may be used separately or for averaging a temperature. Various cooling devices, such as fans, may be controlled by one or more of the temperature data.

Figure 1:
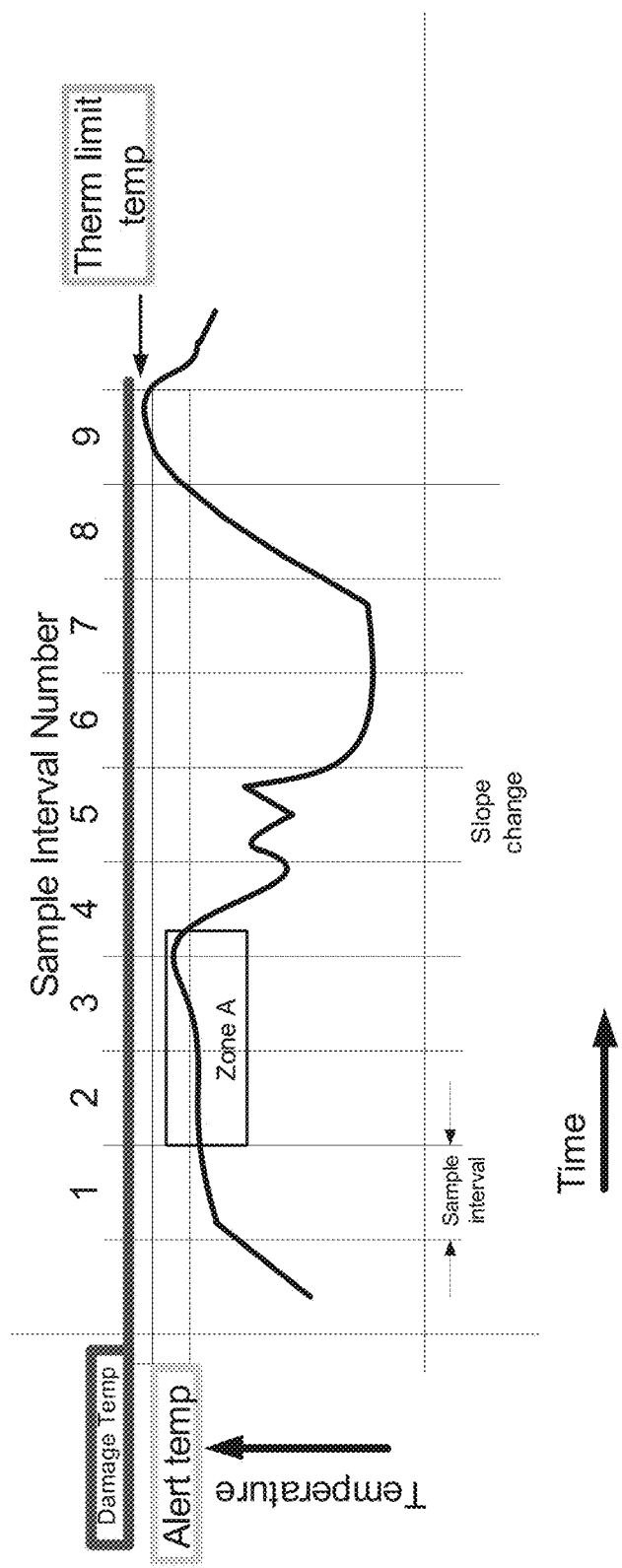
FIG. 1 shows a timing diagram with subsequent sample intervals.

FIG. 1 shows an exemplary course of a temperature profile. It can be seen that knowing the rate of ascension would be very important in knowing how fast to drive the fan to reduce the temperature within the device. The calculations parameters are in number of samples, not time, as the user sets the samples/second rate for the temperature conversion. However, samples could also be controlled to be provided per time. By knowing the number of samples and the samples per second, the denominator in the difference equation may be calculated directly.

$$\frac{\Delta T}{\Delta t} = \frac{[T(t_{max}) - T(t_0)] \cdot \text{gain}}{\text{samples}}$$

where:

$T(t_{max})$=temperature the end of the interval $T(t_0)$=temperature at the beginning of the interval    (Equation 1)

The calculation may become corrupt, if the temperature changes slope in the middle of the sample period, as the calculation assumes a monotonic slope. If this occurs, this solution records the maximum (or minimum) temperature where the slope changed, and sets a flag indicating slope has changed. If the slope should change a second time, a bit indicating whether an even or odd number of reversals has happened. This allows the user to determine if the direction of temperature change at the end of the interval had changed. An even number indicates the direction is the same; an odd number says the temperature reversed direction.

To illustrate this using the diagram in FIG. 1, in Zone A, the temperature is approaching a thermal limit, and half way through period 3 enters the "Alert" limit temperature. But the slope is very slow. The resultant rate of change would be fairly small, indicating only a small change in the current thermal control loop is required to reduce the temperature. Sample Interval 4 clearly shows a rapid decrease, allowing the thermal control loop to rapidly reduce the fan speed, increase clock speed, whatever controls are available.

The temperature once again approaches the Alert limit in sample interval 8. This time, there is a substantial slope, and is reflected in the calculations. This indicates a much greater fan speed, or much less clock speed, is required to control the temperature so the damage temperature is not reached. The control loop receives the information that the temperature is under control at the end of sample interval 9, where the slope has changed, and the rate of change is a much smaller value. The slope changing indicates temperature is falling.

Likewise, a system needing very tightly controlled cold temperatures would benefit from this same device. The ability to know the "speed" at which the temperature is changing is more critical here, since the typical unit requires more than a couple seconds to adjust the temp when out of limits.

Figure 2:
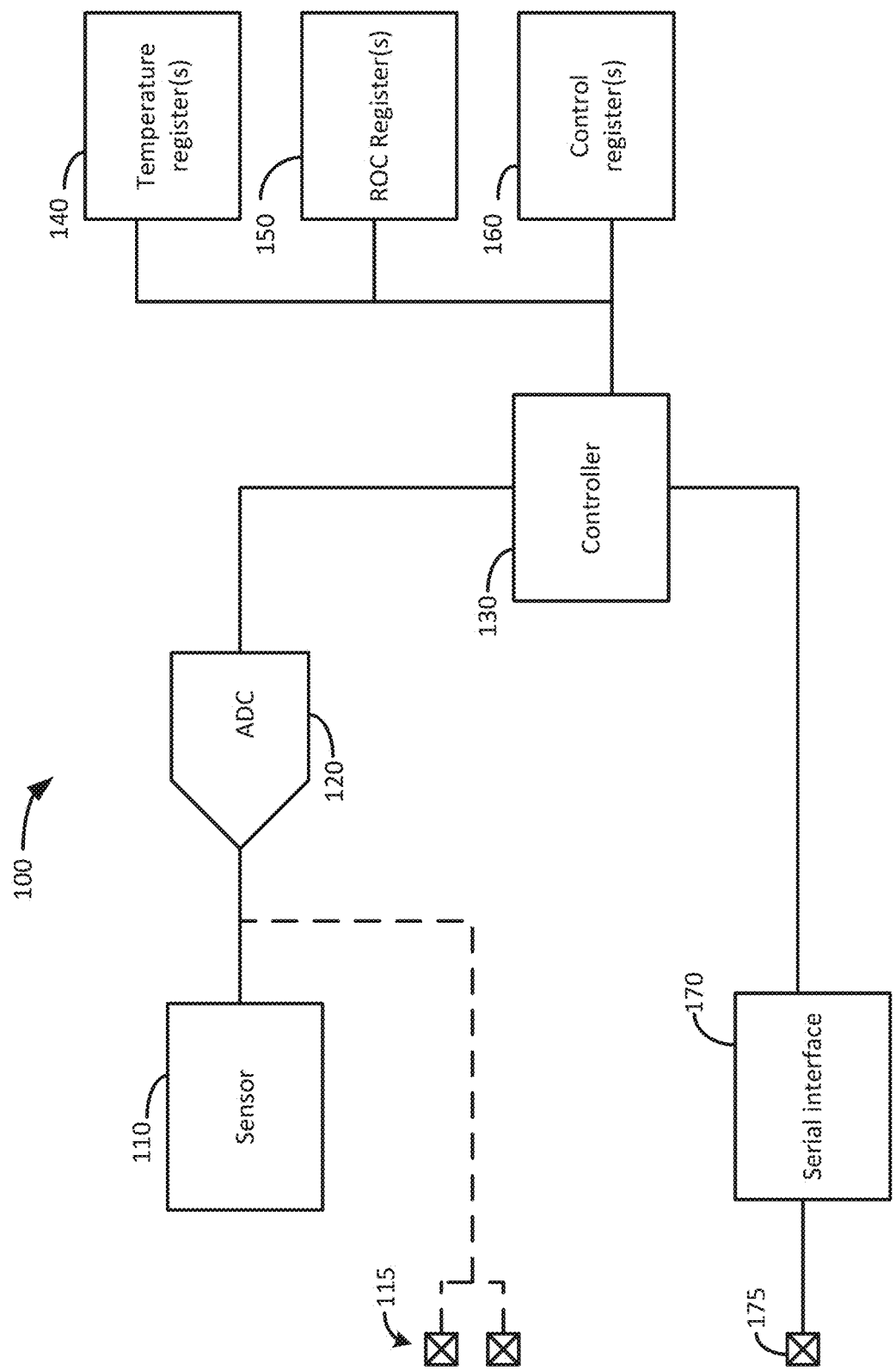
FIG. 2 shows a block diagram of a temperature sensor according to various embodiments.

FIG. 2 shows a block diagram of a possible embodiment of an integrated temperature sensor 100. The actual sensor can be integrated sensor 110, for example a diode temperature sensor. Alternatively, the device 100 may provide for two external pins to connect to an external sensor diode. According to some embodiments, an internal and one or more external diode connections for external sensor diodes may be implemented. Such a device may include internal multiplexers to switch between internal and external diode sensors. Other sensor elements may be used and the present disclosure is not limited to diode sensor elements.

The internal sensor 110 or sensor connections 115 are coupled with an analog-to digital converter (ADC) 120. Analog preprocessing may be provided if necessary between the sensor element 110 and the ADC 120. The ADC 120 may be coupled with an internal controller 130, such as a state machine or programmable logic device. The controller 130 is connected with various storage registers 140, 150 and control registers 160. Furthermore, a digital interface, for example, a serial interface 170, such as an I2C interface, an SMBus interface, or an SPI interface, may be provided and coupled with the controller 130. The controller 130 is configured to control the conversion process, in particular, the conversion rate of the ADC 120, the conversion period and also the parameters of the serial interface, etc. In addition, the controller may include a simple arithmetic logic unit to perform basic calculations such as averaging.

The controller is configured to start the ADC 120 in intervals according to a preset period register in the control registers 150 and perform sequential temperature measurements. The controller 130 reads the conversion result and may perform post processing and conversion into a temperature value. Such a post-processed value may then be stored in register 140. Register 140 could be implemented as a single register holding the last conversion value or it could be implemented as ring buffer holding a plurality of sequential measurement values. Other buffer structures may apply according to various embodiments.

According to various embodiments, the controller 130 is configured to also perform a rate of change calculation as explained above. To this end, the controller 130 can be configured to use two subsequent measurements, respectively and divide the temperature difference between the two measurements by the time period between the two measurements. However, the number of temperature samples used to calculate the slope may be programmable and may therefore be greater than 2 according to some embodiments. Thus, in a sequence of temperature measurements, the current temperature slope is always available and can be stored in an associated register 150. Again a ring buffer could be implemented that is synchronized with a temperature value ring buffer. As mentioned above, other buffer structures may apply.

The controller 130 may further provide for a comparison of a measured temperature with one or more threshold values. Thus, the control registers 160 may include one or more threshold registers, for example to store upper and lower temperature limit values.

The control registers can also be configured to include calibration registers and parameters for digital filters.

Figure 3:
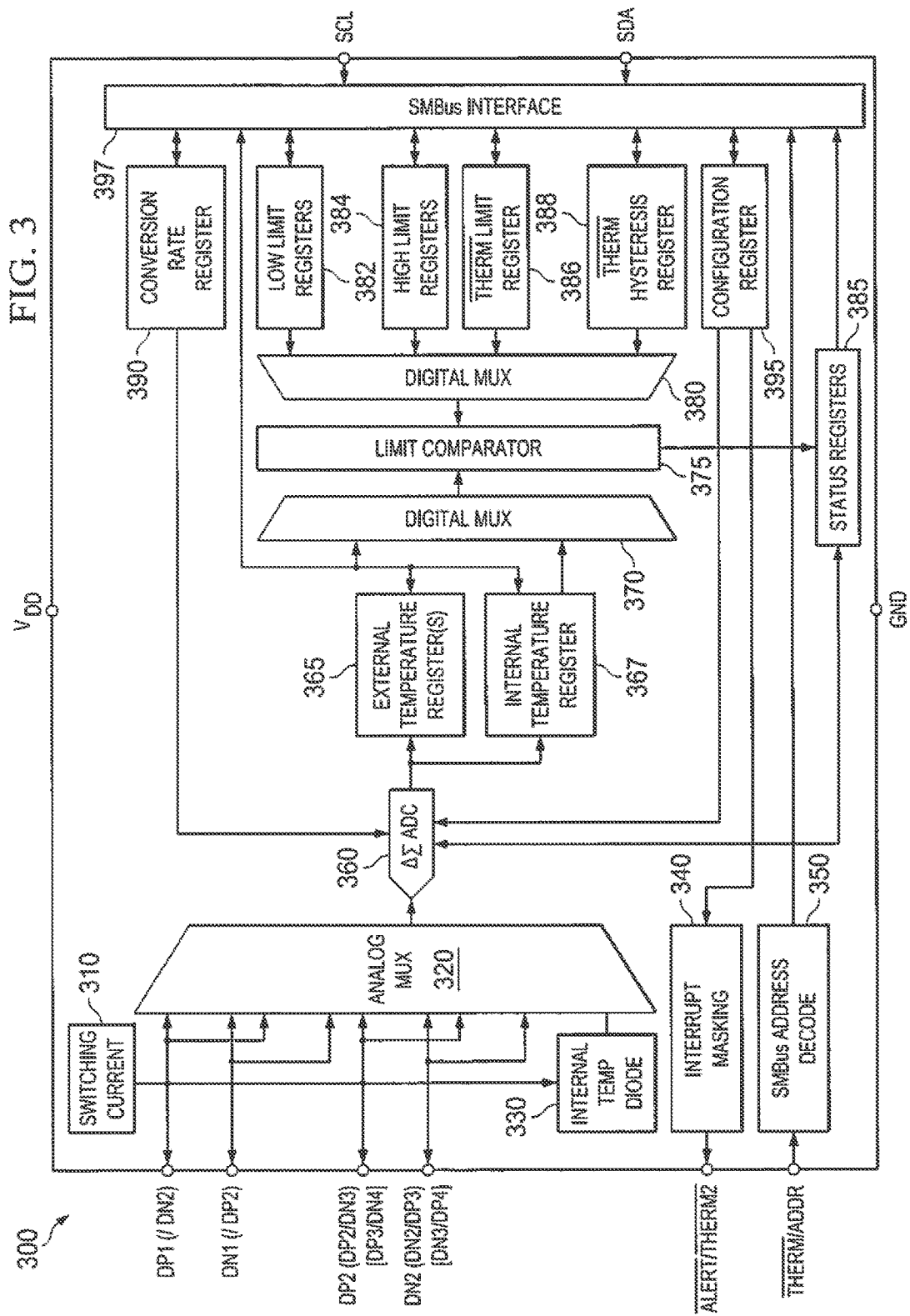
FIG. 3 shows a more detailed block diagram of a specific embodiment of a temperature sensor.
Figure 4:
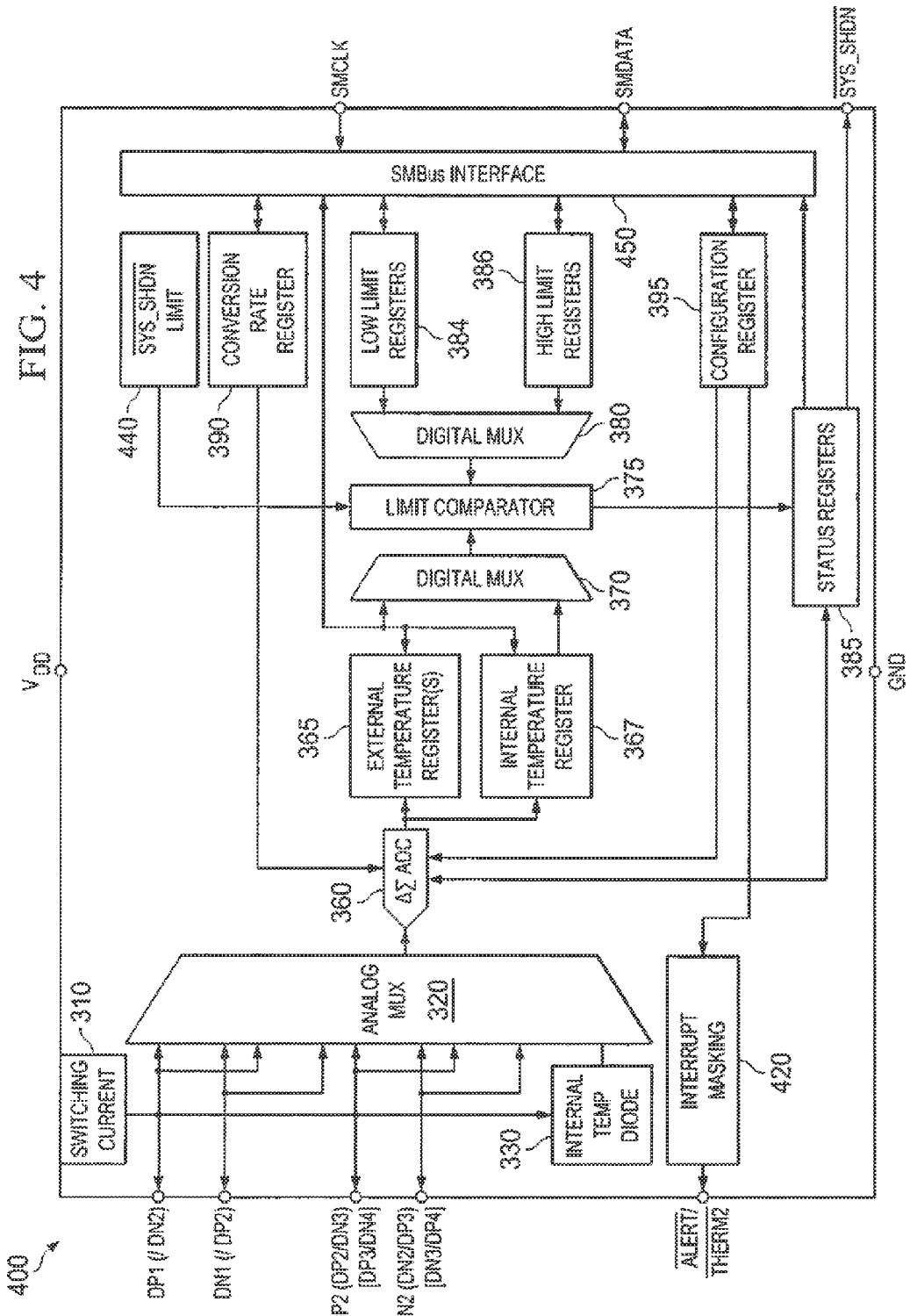
FIG. 4 shows a block diagram of another specific embodiment of a temperature sensor.

FIG. 3 and FIG. 4 shows other more detailed block diagram of integrated temperature sensor device 300 and 400 according to some embodiments. Similar elements have similar reference symbols. Various external sensors and an internal sensor 330 supplied by a voltage/current regulator 310 may be provided. A multiplexer 320 is used to switch between the various sensors. The output of the multiplexer 320 is coupled with an ADC 360 whose output is coupled with various registers, for example register block 365 comprising registers for the external sensor and register block 367 comprising registers for the internal temperature sensor 330. Furthermore, a first digital multiplexer 370 connects to register blocks 365 and 367 on one hand and a limit comparator 375 on the other hand. The limit comparator 374 is further connected with a second digital multiplexer 380 which can select between various registers 382, 384, 386, and 388 for storing low, high, alarm and hysteresis values, respectively. Configuration registers 395 may store parameters for the ADC and for an interrupt masking unit 340 which can be configured to output alerts and "thermal" interrupts. A conversion register 390 is provided for storing the measurement interval length. Furthermore, a status register 385 may comprise status bits that will be controlled by the ADC 320 and the comparator 375. A serial interface 397 connects to all registers and a address decoding unit 350. The serial interface may be configured to operate as an I2C interface wherein address unit 350 may be used to provide additional address setting information, for example through one or more external pins.

FIG. 4 shows a similar block diagram wherein the interface is configured to operate as an SMBus interface 450. Here no address decoding is provided which may reduce the number of external pins. FIG. 54 also shows an interrupt masking unit 420 for generating external alert signals and interrupts as will be explained in more detail below. Either implementation may provide for a shutdown pin and associated registers and logic 440 as shown only in FIG. 4. If a predefined signal is applied to this pin, the device may go into a sleep mode to save energy. Bother embodiments shown in FIGS. 3 and 4 do not specifically show a controller unit such as a simple state machine or programmable logic device ort any other suitable control mechanism.

Figure 5A:
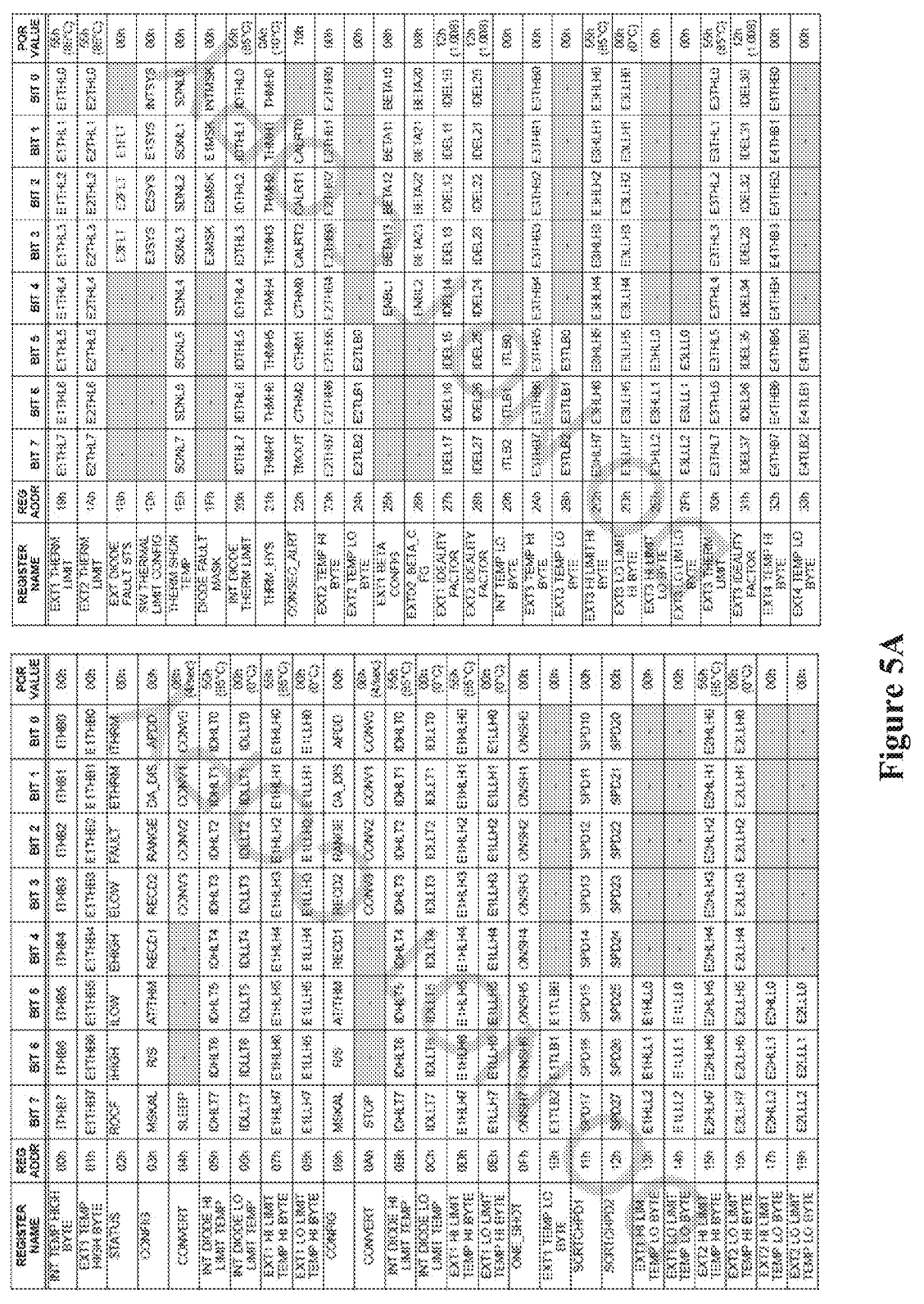
Figure 5B:
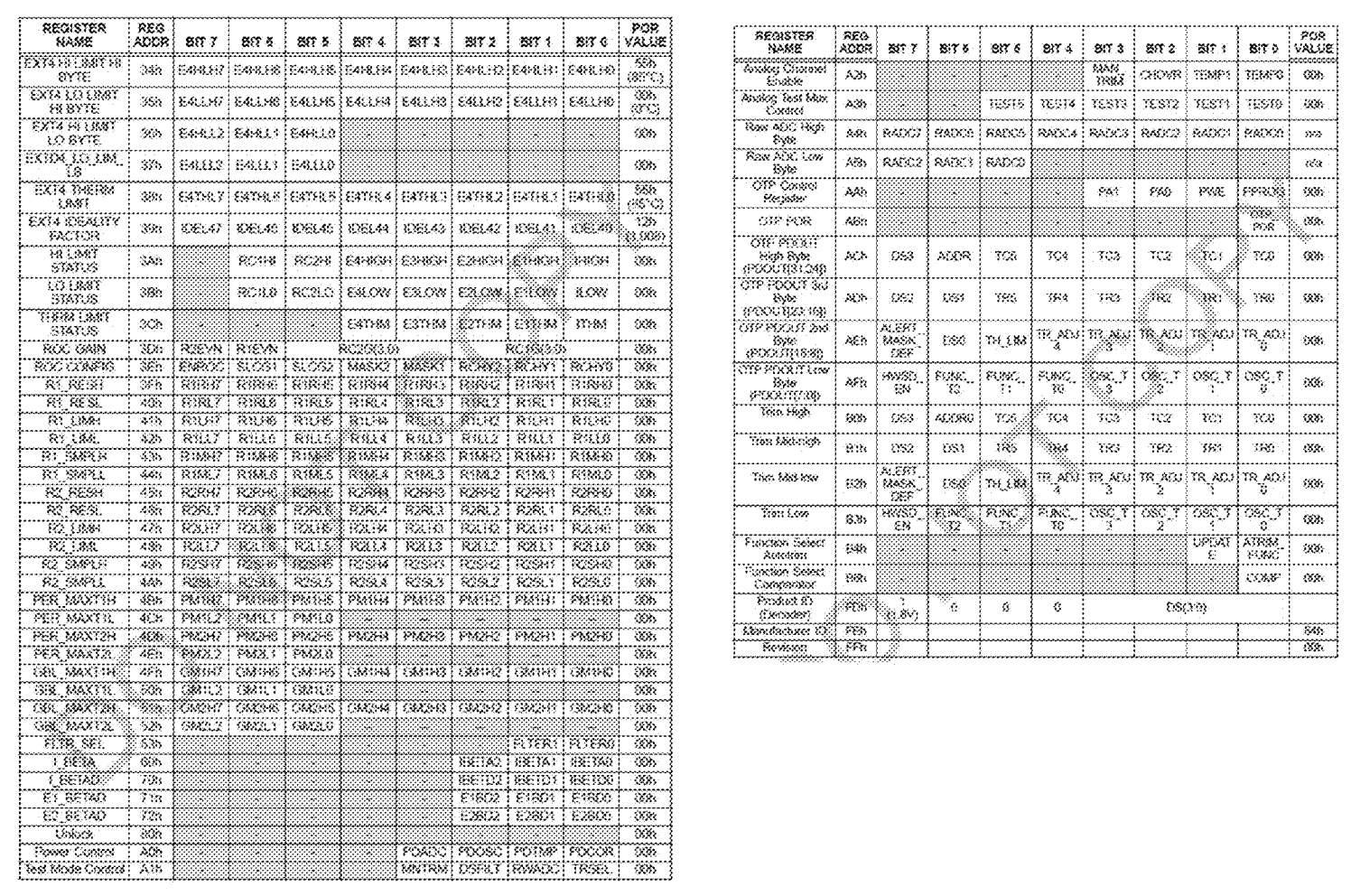

FIGS. 5A and 5B shows an exemplary block diagram of a register block that can be used with any of the above mentioned embodiments. The register block shown in FIGS. 5A and B comprises a plurality of different registers which according to some embodiments may not be necessary and therefore not implemented. Details of such registers will be explained with the specific embodiments of devices according to FIGS. 3 and 4. As mentioned above, at a minimum, a device according to various embodiments may comprise a temperature register for storing an actual measured temperature and a rate of change register storing a dynamic temperature change value. Thus, absolute temperature values and temperature change values dT/dt can be provided through the serial interface to a system control unit.

The following describes certain features of various embodiments of the devices as for example shown in FIGS. 3 and 4. As mentioned above, these are mere examples and other embodiments may not use all the options and other combination of features are possible as will be appreciated by a person skilled in the art. Thus, while the following describes embodiments with certain features, these are not necessarily essential and may not be required in other embodiments. The integrated devices as shown in FIGS. 3 and 4 monitor one internal diode and up to four externally connected temperature diodes. Other combinations are possible and the present disclosure is not limited to any of the following embodiments.

Thermal system management is performed in cooperation with a host device as shown in FIGS. 6A and B. This consists of the host reading the temperature data of both the external and internal temperature diodes of the integrated devices as shown in FIGS. 3 and 4 and using that data to control the speed of one or more fans. The integrated devices as shown in FIGS. 3 and 4 have two levels of monitoring. The first provides a maskable ALERT signal to the host when the measured temperatures exceeds user programmable limits. This allows the integrated devices as shown in FIGS. 3 and 4 to be used as an independent thermal watchdog to warn the host of temperature hot spots without direct control by the host. The second level of monitoring provides a non maskable interrupt on the THERM pin if the measured temperatures meet or exceed a second programmable limit. For the integrated devices as shown in FIGS. 3 and 4, External Diode channels 2 and 3 are only compatible with general purpose diodes (such as a 2N3904). For the integrated devices as shown in FIGS. 3 and 4, the External Diode 2 channel is compatible with both substrate and diode connected transistors.

FIG. 6A shows examples of a system level block diagram of the integrated devices as shown in FIG. 3. FIG. 6B shows a system level block diagram of the integrated devices as shown in FIG. 4.

The integrated devices as shown in FIGS. 3 and 4 have three power states.

Active (Run)—In this state, the ADC is converting on all temperature channels at the programmed conversion rate. The temperature data is updated at the end of every conversion and the limits are checked. In the Active state, writing to the one-shot register will do nothing.

Sleep (Stop)—This is the lowest power state. In this state, the majority of circuitry is powered down to reduce supply current. The temperature data is not updated and the limits are not checked. The device is awakened by the correct I2C Slave address being broadcast. Data will not be immediately available but will return a NACK until the device is active and has data available. The device enters Sleep mode through a register command.

Standby (One-shot)—While the device is in Standby, the host can initiate a conversion cycle on demand (see Register 3-16). After the conversion cycle is complete, the device will return to the Standby state. The difference between Sleep and Standby is the time it takes to receive valid data back from the device The integrated devices as shown in FIGS. 3 and 4 may be configured for different conversion rates based on the system requirements. The default conversion rate can be, for example, 4 conversions per second. Other available conversion rates may be selected according to a conversion table.

The round robin must obey the ADC timing requirements for all channels. The data is converted and stored as soon as it is available for a specific channel. When the ADC has finished converting on all the active input channels, the device will power down the Temperature Block, ADC, and Reference until the next set of conversions begin according to some embodiments. The channel order for conversions can be selected according to various embodiments.

The ADC resolution is controlled by digital input signals to the EMC 4 block, DI_SEL[3:0}. This controls the width of the conversion for the ADC converter. The ADC Resolution depends on the number of channels active, the conversion rate, and dynamic averaging. The ADC data output is transferred least significant bit first for any given resolution.

When the ADC data is acquired by the digital block, it is shifted based on the resolution before it is loaded into any data registers (including Raw ADC).

At startup, or upon power up, the reference will require a certain time to settle. When the ADC is finished, it asserts the ADC_AQ bit high at which time the ADC data is valid. The data will remain available until the START signal goes low at which point it is cleared.

The integrated devices as shown in FIGS. 3 and 4 may contain the optional capability to perform frequency hopping while measuring external temperature diodes. This function is enabled by the DI_FREQ_EN bit and controlled by the oscillator block. The frequency hopping logic has options to support two frequency inputs either 16 MHz or 20 MHz. This is selected by the DI_SEL_20M bit ('0'=16 MHz, '1'=20 MHz). As the resolution is changed, the number of temperature samples acquired (as well as different frequencies used) likewise changes. For resolutions greater than 10 bit, 32 frequencies are used. For 9 bit resolution and 8 bit resolution, the number of different frequencies and their value are adjusted such that the average frequency is equal to 100 kHz.

Table 1 shows the effective conversion rates depending on the resolution of the ADC for a 16 MHz clock.

TABLE 1

| Resolution (bits) | # of Temp Samples | # of Sampling Frequencies | ADC Conv. Time (mS) |
|---|---|---|---|
| 8 | 8 | 8 | 2.56 |
| 9 | 16 | 16 | 5.12 |
| 10 | 32 | 32 | 10.24 |
| 11 | 64 | 32 | 20.48 |
| 12 | 128 | 32 | 40.96 (recommended) |
| 13 | 256 | 32 | 81.92 |
| 14 | 512 | 32 | 163.84 |
| 15 | 1024 | 32 | 327.68 |

The range of the divider and frequency values are shown in Table 2 for a 16 MHz clock and in Table 3 for a 20 MHz clock. The low frequency divide ratio sets the low end of the hopped frequency while the high frequency divider shows the high end of the hopped frequency.

TABLE 2

| Resolution | low Frequency Divide ratio | High Frequency | High frequency divide ratio | Low Frequency |
|---|---|---|---|---|
| disabled | 82 | 97.6 kHz | 82 | 97.6 kHz |
| 8 | 76 | 105.3 kHz | 84 | 95.3 kHz |
| 9 | 72 | 111.1 kHz | 88 | 90.9 kHz |
| 10 | 68 | 117.6 kHz | 100 | 80 kHz |
| 11 | 68 | 117.6 kHz | 100 | 80 kHz |
| 12 | 68 | 117.6 kHz | 100 | 80 kHz |
| 13 | 68 | 117.6 kHz | 100 | 80 kHz |
| 14 | 68 | 117.6 kHz | 100 | 80 kHz |
| 15 | 68 | 117.6 kHz | 100 | 80 kHz |

TABLE 3

| Resolution | low Frequency Divide ratio | High Frequency | High frequency divide ratio | Low Frequency |
|---|---|---|---|---|
| disabled | 102 | 97.6 kHZ | 102 | 97.6 kHz |
| 8 | 96 | 104.2 kHz | 104 | 95.1 kHz |
| 9 | 92 | 108.7 kHz | 108 | 92.6 kHz |
| 10 | 84 | 119.0 kHz | 116 | 86.2 kHz |
| 11 | 84 | 119.0 kHz | 116 | 86.2 kHz |
| 12 | 84 | 119.0 kHz | 116 | 86.2 kHz |
| 13 | 84 | 119.0 kHz | 116 | 86.2 kHz |
| 14 | 84 | 119.0 kHz | 116 | 86.2 kHz |
| 15 | 84 | 119.0 kHz | 116 | 86.2 kHz |

The divide ratio of 100 which would correspond with 100 kHz frequency is never selected, otherwise, the divide ratios increase by 1 across the entire divide ratio range. The frequency values will change by approximately 1 kHz per step though this is not a fixed resolution.

In order to maintain the average frequency, the resolution dependent divide pairs are skewed toward the lower frequency range by a four settings.

The digital averaging applies to the External Diode 1 channel (when the Hardware Thermal Shutdown circuitry is enabled only) after the temperature data is clamped and before the fault queue. This averaging will constantly update the temperature with a running average of the previous 4 or 8 measurements.

For the first measurement immediately after power up, the averaging stack will be filled with the first measured temperature and then proceed in a FIFO order on subsequent measurements.

Each temperature channel may have a hard-wired offset that adjusts the temperature value. This offset is set in metal at the schematic top level.

Dynamic averaging causes the integrated devices as shown in FIGS. 3 and 4 to measure the external diode channels for an extended time based on the selected conversion rate. This functionality can be disabled for increased power savings at the lower conversion rates. When dynamic averaging is enabled, the device will automatically adjust the sampling and measurement time for the external diode channels. This allows the device to average 2× or 16× longer than the normal 11 bit operation (nominally 21 ms per channel) while still maintaining the selected conversion rate. The benefits of dynamic averaging are improved noise rejection due to the longer integration time as well as less random variation of the temperature measurement.

When enabled, the dynamic averaging applies when a one-shot command is issued. The device will perform the desired averaging during the one-shot operation according to the selected conversion rate. When enabled, the dynamic averaging will affect the average supply current based on the chosen conversion rate.

The integrated devices as shown in FIGS. 3 and 4 can generate as many as 15 variants, as defined by the One Time Programmable (OTP) personality bits in the OTP bank. These bits have been previously defined as External Diode 2 Enable (EXT2_EN), External Diode 2 Anti-Parallel Diode (APD) Enable (EXT2_APD_EN), THERM/ALERT Decode Select (ADDR_SEL_CH), and Fixed Address Bit 0 (ADDR0). These bits defined a total of 8 parts, using only half of the decoded states available.

In addition to these OTP bit changes, the bit to select fixed or decoded address (ADDR_SEL_EN) has been obsoleted, and will now function to select the THERM limit temp of 85C or 125C and is TH_LIM.

According to some embodiments, the rate of change function approximates the derivative of the temperature using a difference equation. The equation shown in Equation 1 is the basis for calculation. The period width is stored in two consecutive registers. This represents the "sample period" as defined in number of samples. FIGS. 5A and B show an exemplary implementation of register blocks that could be used in a temperature sensor device according to some embodiments. R(x)_SMPLH: Rate of Change Samples HIGH BYTE REGISTER (address 43h,49h) and R(x)_SMPLL: Rate of Change Samples LOW BYTE REGISTER (address 44h,4Ah) hold these values. The gain applied to the result is stored in ROC_gain: Rate of Change gain REGISTER (address 3dh). The effective gains are shown in the register definition. For example, register ROC_GAIN may be organized as follows:

bit 7 R2EVN—Indicates whether the number of slope reversals was even or odd
1=Even number of slope reversals during the sampling period
0=Odd number of reversals during the sampling period bit 6 R1EVN—Indicates whether the number of slope reversals was even or odd
1=Even number of slope reversals during the sampling period
0=Odd number of reversals during the sampling period
bit 5:3 RC1_GAIN: This represents the binary gain applied to the difference equation
0h=1
1h=2
2h=4
3h=8
4h=16
5h=32
6h=64
7h=128
bit 2:0 RC2 GAIN: This represents the binary gain applied to the difference equation
0h=1
1h=2
2h=4
3h=8
4h=16
5h=32
6h=64
7h=128

Since this is sampled over time, there is a bit for each channel that indicates a change in slope has occurred. These bits (one for each channel) will assert when the result of two consecutive sample differences exceed the threshold limit as defined by the Hysteresis value defined in ROC_config: Rate of Change configuration REGISTER (address 3Eh). This will not reset the ROC calculations. ROC_config register may be organized as follows:

bit 7 EN_ROC: Enables the Rate of Change calculations
1=Rate of Change enabled
0=Rate of Change disabled
bit 6 SLCG2: reports a change in slope during the Rate of Change calculation for External Channel 2
1=slope changed direction
0=monotonic slope
bit 5 SLCG1: reports a change in slope during the Rate of Change calculation for External Channel 1
1=slope changed direction
0=monotonic slope
bit 4 MASK2: Masks an event from setting the ALERT pin from Channel 2
1=Event is Masked.
0=Event will assert the ALERT pin
bit 3 MASK1: Masks an event from setting the ALERT pin Channel 1
1=Event is Masked.
0=Event will assert the ALERT pin
bit 2:0 RCHY: Hysteresis setting for Rate of Change Slope reversal. Deviations greater than this setting will result in the bit being set.
111=4.000° C.
110=3.000° C.
101=2.000° C.
100=1.000° C.
011=0.500° C.
010=0.250° C.
001=0.125° C.
000=0.000° C.

The Limit registers (R(X) LIMH: Rate of Change ALERT Limit High BYTE REGISTER (address 41h,47h) and R(X) LIML: Rate of Change ALERT Limit LOW BYTE REGISTER (address 42h,48h)) and Results registers (R(X)

RESh: Rate of Change RESULTS HIGH BYTE REGISTER (address 3fh, 45h) and R(x) RESL: Rate of Change RESULTS LOW BYTE REGISTER (address 40h, 46h)) are signed, 2s-complement numbers stored in two(2) consecutive registers. Should the Rate of Change result stored in exceed the programmed limit the appropriate status register bits will be set, HI_LIM_STS—High Limit Status Register (address 3Ah) for a positive limit, or LO_LIM_STS—Low Limit Status Register (address 3Bh) for a negative limit. The ALERT pin may be asserted or masked, as set by ROC_config: Rate of Change configuration REGISTER (address 3Eh). The MASK bit will not prevent the Status bits in the from asserting, but if set, will prevent the ALERT pin from asserting.

The status register STATUS (address 02H) may be organized as follows:

bit 7 ROCF—This bit indicates that the Rate of Change limit has been exceeded. When set, this bit will assert the ALERT pin.
1=ROC above limit
0=ROC not above limit bit 6 IHIGH—This bit indicates the Internal Diode channel exceeds its programmed high limit. When set, this bit will assert the ALERT pin.
1=Reported temperature above the high limit
0=Reported temperature is not above the high limit bit 5 ILOW—This bit indicates the Internal Diode channel drops below its programmed low limit. When set, this bit will assert the ALERT pin.
1=Reported temperature below the low limit
0=Reported temperature is not below the low limit bit 4 EHIGH—This bit indicates the External Diode channel exceeds its programmed high limit. When set, this bit will assert the ALERT pin.
1=Reported temperature above the high limit
0=Reported temperature is not above the high limit bit 3 ELOW—This bit indicates the External Diode channel drops below its programmed low limit. When set, this bit will assert the ALERT pin.
1=Reported temperature below the low limit
0=Reported temperature is not below the low limit bit 2 FAULT—This bit indicates when a diode fault is detected. When set, this bit will assert the ALERT pin.
1=open circuit or short of a diode
0=no fault reported bit 1 ETHRM—This bit indicates the External Diode channel exceeds the programmed Therm Limit. When set, this bit will assert the THERM pin. This bit will remain set until the THERM pin is released at which point it will be automatically cleared.
1=Reported temperature above the high limit
0=Reported temperature is not above the high limit bit 0 ITHRM—This bit is set when the Internal Diode channel exceeds the programmed Therm Limit. When set, this bit will assert the THERM pin. This bit will remain set until the THERM pin is released at which point it will be automatically cleared.
1=Reported temperature above the high limit
0=Reported temperature is not above the high limit The configuration register CONFIG (address 03H and 09H) may be organized as follows:

bit 7 MASK_ALL—Masks the ALERT pin from asserting when the ALERT pin is in interrupt mode. This bit has no effect when the ALERT pin is in comparator mode. MASK_ALL bit default is set by the ALERT_MASK_DEF_OTP bit (see DYN_TRIM_HIL—Dynamic Trim Register middle-LOW byte Register (address b2h)).

1=The ALERT pin is masked and will not be asserted for any interrupt condition when the ALERT pin is in interrupt mode. The Status Registers will be updated normally.
0=(set by OTP) The ALERT pin is not masked. If any of the appropriate status bits are set, the ALERT pin will be asserted.

bit 6 RUN/STANDBY—Controls Active/Standby states.
1=The device is in Standby state and not converting (unless a one-shot has been commanded).
0=The device is in Active state and converting on all channels.

bit 5 ALERT/THRM—Controls the operation of the ALERT pin. When the ALERT pin is in comparator mode, each channel has a consecutive counter OR'ed to assert the ALERT pin. The ALERT pin is de-asserted after one measurement is below the High Limit minus the Therm Hysteresis.
1=The ALERT pin acts in comparator mode as described in Section 3.16.2. In this mode the MASK_ALL bit is ignored.
0=The ALERT pin acts in interrupt mode as described in Section 3.16.1.

bit 4 RECD1/2—Disables the Resistance Error Correction (REC) for the DP1/DN1 pins.
1=REC is disabled for the DP1/DN1 pins.
0=REC is enabled for the DP2/DN2 pins.

bit 3 RECD3/4—Disables the Resistance Error Correction (REC) for External Diode 3 and External Diode 4.
1=REC is disabled for External Diode 3 and External Diode 4.
0=REC is enabled for External Diode 3 and External Diode 4.

bit 2 RANGE—Configures the measurement range and data format of the temperature channels.
1=The temperature measurement range is −64° C. to +191.875° C. and the data format is offset binary.
0=The temperature measurement range is 0° C. to +127.875° C. and the data format is binary.

bit 1 DA_DIS—Disables the dynamic averaging feature on all temperature channels.
1=The dynamic averaging feature is disabled. All temperature channels will be converted with a maximum averaging factor of 1× (equivalent to 11-bit conversion). For higher conversion rates, this averaging factor will be reduced.
0=The dynamic averaging feature is enabled. All temperature channels will be converted with an averaging factor that is based on the conversion rate.

bit 0 APDD—Disables the anti-parallel diode operation.
1=Anti-parallel diode mode is disabled. Only one external diode will be measured on the DP1/DN1 and DP2/DN2 pins.
0=Anti-parallel diode mode is enabled. Two external diodes will be measured on the DP2 and DN2 pins.

In addition to the functions described above, two additional temperature values are stored in register for retrieval. The maximum temperature for a given sample period is stored in a register that updates every sample period, and a second register that stores a "global value" and cleared only when read. The purpose of this register is to determine a maximum or minimum temperature independent of the sample period.

The THERM output is asserted independently of the ALERT output and cannot be masked. Whenever any of the measured temperatures exceed the user programmed Therm Limit values for the programmed number of consecutive measurements, the THERM output is asserted. Once it has been asserted, it will remain asserted until all measured temperatures drop below the Therm Limit minus the Therm Hysteresis (also programmable).

When the THERM pin is asserted, the Therm status bits will likewise be set. Reading these bits will not clear them until the THERM pin is de-asserted. Once the THERM pin is deserted, the THERM status bits will be automatically cleared.

The ALERT/THERM2 pin is an open drain output and requires a pull-up resistor to VDD and has two modes of operation: interrupt mode and comparator mode. The mode of the ALERT/THERM2 output is selected via the ALERT/THERM2 bit (see CONFIG: Configuration Register (Address 03h and 09h)).

When configured to operate in interrupt mode, the ALERT/THERM2 pin asserts low when an out of limit measurement (>high limit or <low limit) is detected on any diode or when a diode fault is detected. The ALERT/THERM2 pin will remain asserted as long as an out-of-limit condition remains. Once the out-of-limit condition has been removed, the ALERT/THERM2 pin will remain asserted until the appropriate status bits are cleared.

The ALERT/THERM2 pin can be masked by setting the MASK_ALL bit. Once the ALERT/THERM2 pin has been masked, it will be de-asserted and remain de-asserted until the MASK_ALL bit is cleared by the user. Any interrupt conditions that occur while the ALERT/THERM2 pin is masked will update the Status Register normally. There are also individual channel masks (see DIODE FAULT MASK—diode fault mask REGISTER (address 1Fh)).

The ALERT/THERM2 pin is used as an interrupt signal or as an I2C Alert signal that allows an I2C slave to communicate an error condition to the master. One or more ALERT/THERM2 outputs can be hard-wired together.

When the ALERT/THERM2 pin is configured to operate in THERM mode, it will be asserted if any of the measured temperatures exceeds the respective high limit. The ALERT/THERM2 pin will remain asserted until all temperatures drop below the corresponding high limit minus the Therm Hysteresis value.

When the ALERT/THERM2 pin is asserted in THERM mode, the corresponding high limit status bits will be set. Reading these bits will not clear them until the ALERT/THERM2 pin is de-asserted. Once the ALERT/THERM2 pin is de-asserted, the status bits will be automatically cleared.

The MASK_ALL bit will not block the ALERT/THERM2 pin in this mode; however, the individual channel masks will prevent the respective channel from asserting the ALERT/THERM2 pin.

The integrated devices as shown in FIGS. 3 and 4 contain a hardware configured temperature limit circuit that controls the SYS_SHDN pin. The threshold temperature is determined by the pull-up resistors on both the SYS_SHDN and ALERT pins. The Hardware Shutdown circuitry measures the External Diode 1 Channel and compares it against the Hardware Thermal Shutdown Limit. The THERM pin consecutive alert counter (default 4 for the SYS-SHDN pin) applies to this comparison (see FIG. 5). If the temperature meets or exceeds the limit for the number of consecutive measurements, the SYS_SHDN pin is asserted. The SYS_SHDN pin remains asserted until the temperature drops below the limit minus 10° C.

As well, all of the measurement channels (including the External Diode 1 channel) can be configured to assert the SYS_SHDN pin (see). If a channel is configured to assert the SYS_SHDN pin, the temperature on the measured channel must exceed the programmed Therm Limit value. This is treated in the same way as the THERM output with a default of 4 consecutive conversions.

The integrated devices as shown in FIGS. 3 and 4 can monitor the temperature of up to three externally connected diodes. Each external diode channel is configured with Resistance Error Correction and Beta Compensation based on user settings and system requirements.

The device contains programmable High, Low, and Therm limits for all measured temperature channels. If the measured temperature goes below the Low limit or above the High limit, the ALERT pin can be asserted (based on user settings). If the measured temperature meets or exceeds the Therm Limit, the THERM pin is asserted unconditionally, providing two tiers of temperature detection.

The integrated devices as shown in FIGS. 3 and 4 have from none to 4 external diodes, depending on the DEVSEL code chosen through OTP. Likewise, each device has only those registers operational corresponding to the number of external diode channels that have been enabled. This applies to all registers including measure, limits, masks, and interrupt enables.

The device contains both high and low limits for all temperature channels. If the measured temperature exceeds the high limit, then the corresponding status bit is set and the ALERT pin is asserted. Likewise, if the measured temperature is less than or equal to the low limit, the corresponding status bit is set and the ALERT pin is asserted. The data format for the limits must match the selected data format for the temperature so that if the extended temperature range is used, the limits must be programmed in the extended data format. The limit registers with multiple addresses are fully accessible at either address. When the device is in the Standby state, updating the limit registers will have no effect until the next conversion cycle occurs. This can be initiated via a write to the One-shot Register (see ONE_SHOT—ONE-shot temperature conversion initiation REGISTER (address 0fh)) or by clearing the RUN/STOP bit (see CONFIG: Configuration Register (Address 03h and 09h)).

The various Limit registers in the device interact based on both external conditions present on the diode pins as well as changes in register bits in the I2C interface.

The High Limit Status Register contains the status bits that are set when a temperature channel high limit is exceeded. If any of these bits are set, then the HIGH status bit in the Status Register is set. Reading from the High Limit Status Register will clear all bits. Reading from the register will also clear the HIGH status bit in the Status Register.

The ALERT pin will be set if the programmed number of consecutive alert counts have been met and any of these status bits are set. The status bits will remain set until read unless the ALERT pin is configured as a comparator output The Low Limit Status Register contains the status bits that are set when a temperature channel drops below the low limit. If any of these bits are set, then the LOW status bit in the Status Register is set. Reading from the Low Limit Status Register will clear all bits. The ALERT pin will be set if the programmed number of consecutive alert counts have been met and any of these status bits are set. The status bits will remain set until read unless the ALERT pin is configured as a comparator output.

The Therm Limit Registers are used to determine whether a critical thermal event has occurred. If the measured temperature exceeds the Therm Limit, the THERM pin is asserted. The limit setting must match the chosen data format of the temperature reading registers. Unlike the ALERT pin, the THERM pin cannot be masked. Additionally, the THERM pin will be released once the temperature drops below the corresponding threshold minus the Therm Hysteresis.

Parasitic resistance in series with the external diodes will limit the accuracy obtainable from temperature measurement devices. The voltage developed across this resistance by the switching diode currents cause the temperature measurement to read higher than the true temperature. Contributors to series resistance are PCB trace resistance, on die (i.e., on the processor) metal resistance, bulk resistance in the base and emitter of the temperature transistor. Typically, the error caused by series resistance is +0.7° C. per ohm. The integrated devices as shown in FIGS. 3 and 4 automatically correct up to 100 ohms of series resistance.

The integrated devices as shown in FIGS. 3 and 4 are designed for external diodes with an ideality factor of 1.008. Not all external diodes, processor or discrete, will have this exact value. This variation of the ideality factor introduces error in the temperature measurement which must be corrected for. This correction is typically done using programmable offset registers. Since an ideality factor mismatch introduces an error that is a function of temperature, this correction is only accurate within a small range of temperatures. To provide maximum flexibility to the user, the integrated devices as shown in FIGS. 3 and 4 provide a 6-bit register for each external diode where the ideality factor of the diode used is programmed to eliminate errors across all temperatures. When monitoring a substrate transistor or CPU diode and beta compensation is enabled, the Ideality Factor should not be adjusted. Beta Compensation automatically corrects for most ideality errors. These registers store the ideality factors that are applied to the external diodes. Beta Compensation and Resistance Error Correction automatically correct for most diode ideality errors. For CPU substrate transistors that require the BJT transistor model, the ideality factor behaves slightly differently than for discrete diode-connected transistors.

The integrated devices as shown in FIGS. 3 and 4 detect an open on the DP and DN pins, and a short across the DP and DN pins. For each temperature measurement made, the device checks for a diode fault on the external diode channel(s). When a diode fault is detected, the ALERT pin asserts and the temperature data reads 00h in the MSB and LSB registers (note: the low limit will not be checked). A diode fault is defined as one of the following: an open between DP and DN, a short from VDD to DP, or a short from VDD to DN. If a short occurs across DP and DN or a short occurs from DP to GND, the low limit status bit is set and the ALERT pin asserts (unless masked). This condition is indistinguishable from a temperature measurement of 0.000° C. (−64° C. in extended range) resulting in temperature data of 00h in the MSB and LSB registers. If a short from DN to GND occurs (with a diode connected), temperature measurements will continue as normal with no alerts.

The integrated devices as shown in FIGS. 3 and 4 contain multiple consecutive alert counters. One set of counters applies to the ALERT pin and the second set of counters applies to the THERM pin. Each temperature measurement channel has a separate consecutive alert counter for each of the ALERT and THERM pins. All counters are user programmable and determine the number of consecutive measurements that a temperature channel(s) must be out-of-limit or reporting a diode fault before the corresponding pin is asserted. The Consecutive Alert Register determines how many times an out-of-limit error or diode fault must be detected in consecutive measurements before the ALERT or THERM pin is asserted. Additionally, the Consecutive Alert Register controls the I2C Time-out functionality. An out-of-limit condition (i.e., HIGH, LOW, or FAULT) occurring on the same temperature channel in consecutive measurements will increment the consecutive alert counter. The counters will also be reset if no out-of-limit condition or diode fault condition occurs in a consecutive reading. When the ALERT pin is configured as an interrupt, when the consecutive alert counter reaches its programmed value, the following will occur: the STATUS bit(s) for that channel and the last error condition(s) (i.e., E1HIGH, or E2LOW and/or E2FAULT) will be set to '1', the ALERT pin will be asserted, the consecutive alert counter will be cleared, and measurements will continue. When the ALERT pin is configured as a comparator, the consecutive alert counter will ignore diode fault and low limit errors and only increment if the measured temperature exceeds the High Limit. Additionally, once the consecutive alert counter reaches the programmed limit, the ALERT pin will be asserted, but the counter will not be reset. It will remain set until the temperature drops below the High Limit minus the Therm Hysteresis value. Channels that are not enabled are not included in the consecutive alert checking. The signal logic chain is: Limit→Counter→Status→Mask→Pin (THERM and ALERT). For example, if the CALRT[2:0] bits are set for 4 consecutive alerts on an integrated devices as shown in FIGS. 3 and 4, the high limits are set at 70° C., and none of the channels are masked, then the ALERT pin will be asserted after the following four measurements: a) Internal Diode reads 71° C. and both the external diodes reads 69° C. Consecutive alert counter for INT is incremented to 1. b) Both the Internal Diode and the External Diode 1 read 71° C. and External Diode 2 reads 68° C. Consecutive alert counter for INT is incremented to 2 and for EXT1 is set to 1. c) The External Diode 1 reads 71° C. and both Internal Diode and External Diode 2 reads 69° C. Consecutive alert counters for INT and EXT2 are is cleared and EXT1 is incremented to 2. d) The Internal Diode reads 71° C. and both external diodes reads 71° C. Consecutive alert counter for INT is set to 1, EXT2 is set to 1, and EXT1 is incremented to 3. e) The Internal Diode reads 71° C. and both external diodes reads 71° C. Consecutive alert counter for INT is incremented to 2, EXT2 is set to 2, and EXT1 is incremented to 4. The appropriate status bits are set for EXT1 and the ALERT pin is asserted. EXT1 counter is reset to 0 and all other counters hold the last value until the next temperature measurement. All temperature channels use this value to set the respective counters. The consecutive Therm counter is incremented whenever any measurement exceed the corresponding Therm Limit. If the temperature drops below the Therm Limit, the counter is reset. If a number of consecutive measurements above the Therm Limit occurs, the THERM pin is asserted low. Once the THERM pin has been asserted, the consecutive therm counter will not reset until the corresponding temperature drops below the Therm Limit minus the Therm Hysteresis value. The default setting is 4 consecutive out of limit conversions. All temperature channels use this value to set the respective counters. The default setting is 1 consecutive out of limit conversion. When the ALERT pin is in comparator mode, the low limit and diode fault will bypass the consecutive alert counter and set the appropriate status bits but will NOT assert the ALERT pin. When a value is written to this register that is not defined, the command is ignored and the last valid value is maintained.

To reduce the effect of noise and temperature spikes on the reported temperature, the External Diode 1 channel uses a programmable digital filter. This filter can be configured as Level 1, Level 2, or Disabled (default). The Filter Configuration Register controls the digital filter on the External Diode 1 channel. To reduce complexity, the digital filter will only apply to the External Diode channel 1 and 2. Furthermore, this is only the case when APD is not enabled for a given channel. It will apply after the digital block has taken the appropriate 11-bits based on the dynamic averaging. The filter consists of a running average on the external diode channel. The Level 1 filter is a running average of 4× while the Level 2 filter is a running average of 8×. For the first measurement immediately after power-up, the filter will be filled with the results of the first measurement. After this, the filter is operated normally. Any temperature comparisons will be done with the filtered results that are stored in the user register.

The temperature measurement results are stored in the internal and external temperature registers. These are then compared with the values stored in the high and low limit registers. Both external and internal temperature measurements are stored in 11-bit format with the eight (8) most significant bits stored in a high byte register and the three (3) least significant bits stored in the three (3) MSB positions of the low byte register. All other bits of the low byte register are set to zero.

The integrated devices as shown in FIGS. 3 and 4 have two selectable temperature ranges. The default range is from 0° C. to +127° C. and the temperature is represented as binary number able to report a temperature from 0° C. to +127.875° C. in 0.125° C. steps. The extended range is an extended temperature range from −64° C. to +191° C. The data format is a binary number offset by 64° C. The extended range is used to measure temperature diodes with a large known offset where the diode temperature plus the offset would be equivalent to a temperature higher than +127° C.

Figure 7:
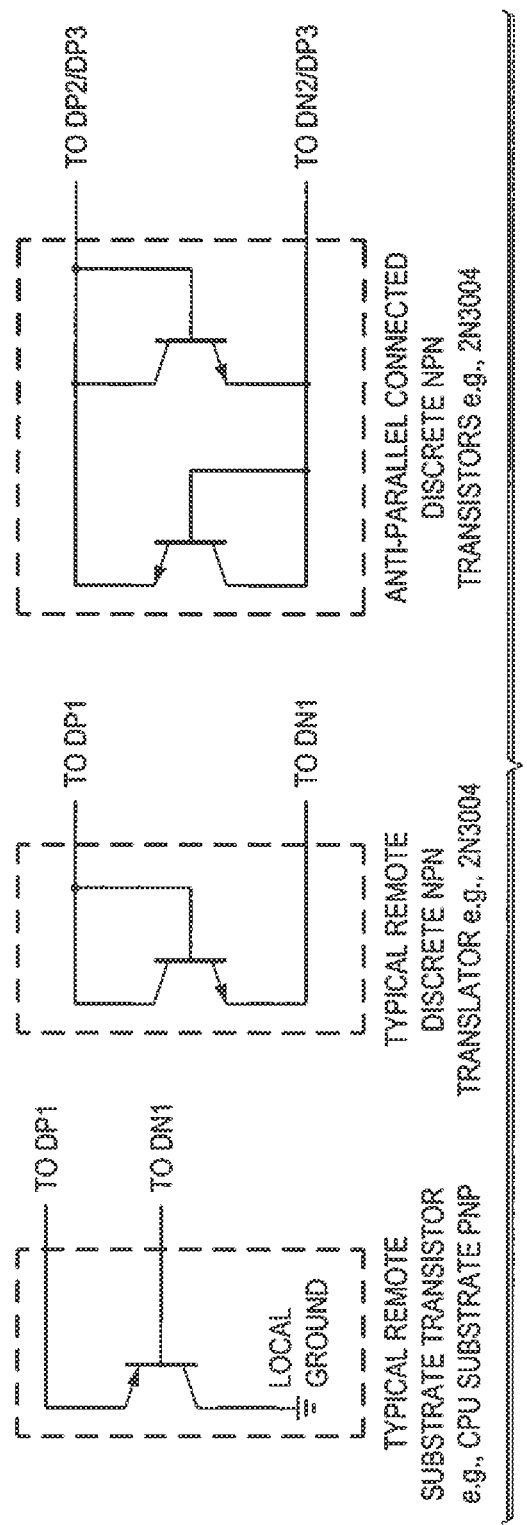
FIG. 7 shows various possible embodiments for a sensor element.

Some embodiments of the integrated devices as shown in FIGS. 3 and 4 support reading two external diodes on the same set of pins (DP1,DN1) and (DP2, DN2). These diodes are connected as shown in FIG. 7. Due to the anti-parallel connection of these diodes, both diodes will be reverse biased by a VBE voltage (approximately 0.7V). Because of this reverse bias, only discrete thermal diodes (such as a 2N3904) are recommended to be placed on these pins.

Some embodiments of the integrated devices as shown in FIGS. 3 and 4 can be configured to measure a CPU substrate transistor, a discrete 2N3904 thermal diode, or a specific processor diode. The diodes can be connected as indicated in FIG. 7.

Some embodiments of the integrated devices as shown in FIGS. 3 and 4 can be configured to measure a CPU substrate transistor, a discrete 2N3904 thermal diode, or an specific processor diode on the External Diode 1 or External Diode 2 channels. For some of the embodiments of the integrated devices as shown in FIGS. 3 and 4, External Diode 2 and External Diode 3 channels are configured to measure a pair of discrete anti-parallel diodes (shared on pins DP2 and DN2). The supported configurations for the external diode channels are shown in FIG. 7.

Figure 8:
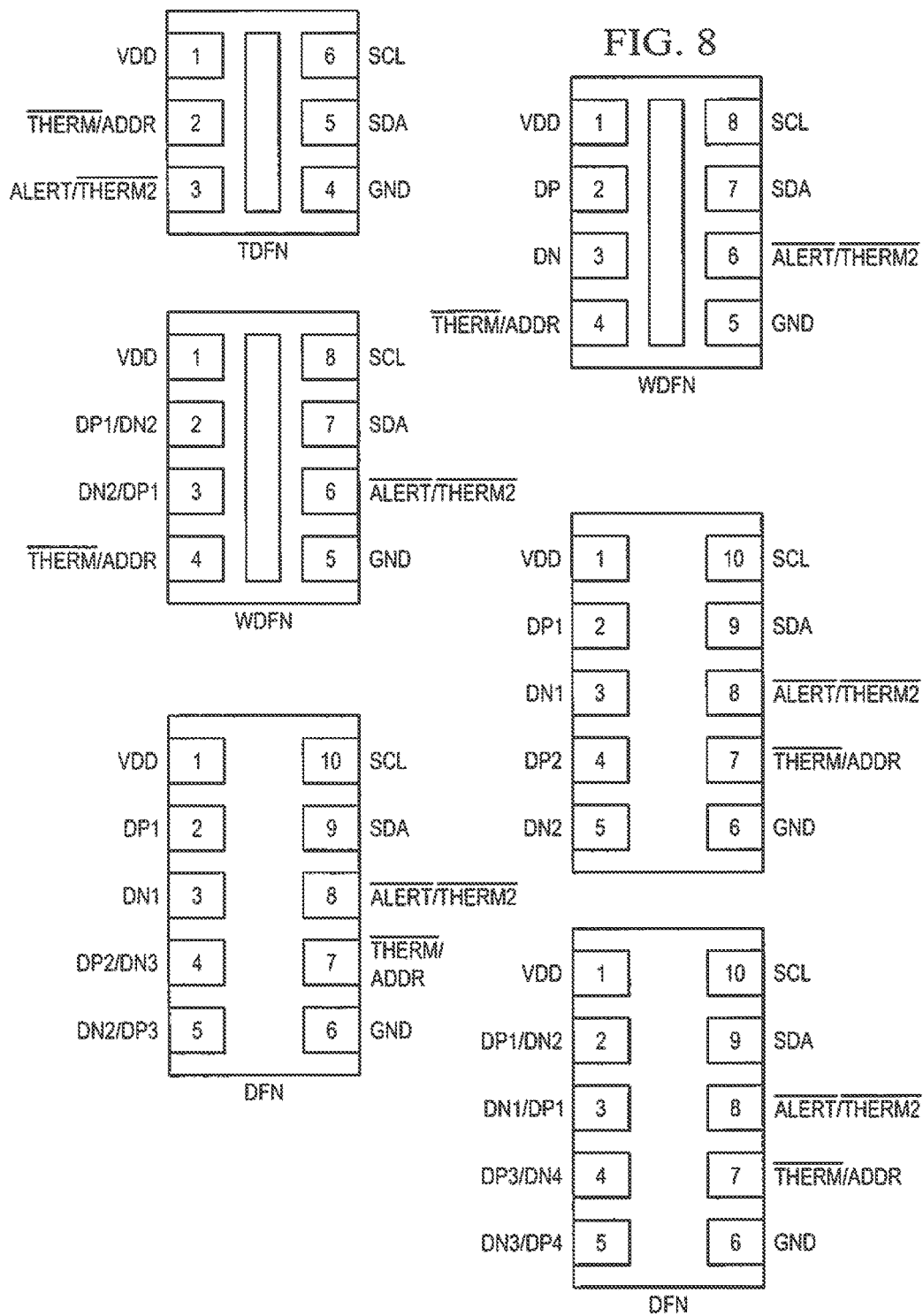
FIG. 8 shows various possible housing and associated pin layouts.

FIG. 8 shows various possible housings and pin arrangements of the integrated devices as shown in FIGS. 3 and 4.

What is claimed is:

1. A temperature sensor device comprising:
   a digital interface;
   a first memory storing a current temperature value which can be read through said digital interface;
   a second memory storing a rate of temperature change value which can be read through said digital interface;
   a processor coupled with the digital interface, the processor configured to:
      issue control signals for cooling based on the current temperature value and the rate of temperature change value;
      identify whether a slope direction changes and store a change of the slope direction in the second memory; and
      identify a plurality of slope direction changes within a measurement interval;
      wherein the control signals include the identification of the plurality of slope direction changes.

2. The temperature sensor according to claim 1, wherein the second memory stores a result of a calculation performed within the temperature sensor using a plurality of sequential temperature measurement samples defining a measurement interval.

3. The temperature sensor according to claim 2, wherein the number of samples is programmable.

4. The temperature sensor according to claim 2, wherein the rate of temperature change value is calculated by:

$$\frac{\Delta T}{\Delta t} = \frac{[T(t_{max}) - T(t_0)] * \text{gain}}{\text{samples}}$$

wherein:
   $T(t_{max})$ is a temperature at an end of the measurement interval;
   $T(t_0)$ is a temperature at a beginning of the measurement interval;
   gain is a factor to be applied to a temperature difference; and
   samples are a number of samples.

5. The temperature sensor according to claim 1, wherein the second memory stores the number of times a slope direction changes within the measurement interval.

6. The temperature sensor according to claim 1, further comprising an external alert output connection controlled by the rate of temperature change value.

7. The temperature sensor according to claim 1, wherein the first memory stores an average temperature value.

8. The temperature sensor according to claim 7, wherein a number of temperature values used to calculate the average temperature value is programmable.

9. The temperature sensor according to claim 1, wherein the second memory is a register accessible by the digital interface.

10. The temperature sensor according to claim 1, wherein the second memory is provided by a plurality of registers.

11. The temperature sensor device of claim 1, wherein the processor is further configured to record a maximum or minimum for a time at which the slope direction changes.

12. An electronic device comprising:
   a temperature sensor configured to determine a rate of change in a measured temperature which can be accessed through a digital interface;
   a cooling fan; and
   a processor coupled with the digital interface of the temperature sensor and being operable to:
      control said cooling fan based on temperature measurement values and said rate of change in temperature retrieved from said temperature sensor through the digital interface;

identify whether a slope direction changes and store a change of the slope direction through the digital interface; and identify a plurality of slope direction changes within a measurement interval;

wherein the control signals include the identification of the plurality of slope direction changes.

13. A method for providing temperature data by a temperature sensor device comprising a digital interface, comprising storing a current temperature value in a first memory which can be read through said digital interface;

storing a rate of temperature change value in a second memory which can be read through said digital interface;

issuing control signals for cooling based on the current temperature value and the rate of temperature change value;

identifying whether a slope direction changes and storing the slope direction change in the second memory; and identifying a plurality of slope direction changes within a measurement interval;

wherein the control signals include the identification of the control signals based upon the plurality of slope direction changes.

14. The method according to claim 13, wherein the second memory stores a calculation performed within the temperature sensor using a plurality of sequential temperature measurement samples defining a measurement interval.

15. The method according to claim 14, wherein the number of samples is programmable.

16. The method according to claim 14, wherein the rate of temperature change value is calculated by:

$$\frac{\Delta T}{\Delta t} = \frac{[T(t_{max}) - T(t_0)] * \text{gain}}{\text{samples}}$$

wherein:
$T(t_{max})$ is a temperature at an end of the measurement interval;
$T(t_0)$ is a temperature at a beginning of the measurement interval;
gain is a factor to be applied to a temperature difference; and
samples are a number of samples.

17. The method according to claim 13, wherein the second memory further stores whether a slope direction changes.

18. The method according to claim 17, wherein the second memory stores the number of times a slope direction changes within the measurement interval.

19. The method according to claim 13, further comprising the step of outputting a signal through an external alert output connection depending on the rate of temperature change value.

20. The method according to claim 13, wherein the first memory is a memory block and also stores an average temperature value.

21. The method according to claim 20, wherein a number of temperature values used to calculate the average temperature value is programmable.

22. The method according to claim 13, wherein the second memory is a register accessible by the digital interface.

23. The method according to claim 13, wherein the second memory is provided by a plurality of registers forming a register block.

24. A method for controlling a temperature in a system comprising a temperature sensor configured to determine a rate of change in a measured temperature which can be accessed through a digital interface, a cooling fan, and a processor coupled with the digital interface of the temperature sensor, the method comprising:

determining a rate of change of a measured temperature;

controlling the cooling fan based on temperature measurement values and said rate of change in the temperature;

identifying whether a slope direction changes and storing the slope direction change in a memory through the digital interface; and identifying a plurality of slope direction changes within a measurement interval;

wherein the control signals include the identification of the plurality of slope direction changes.

* * * * *